United States Patent
King, Jr. et al.

(10) Patent No.: US 8,340,933 B1
(45) Date of Patent: Dec. 25, 2012

(54) METHOD AND APPARATUS FOR PERFORMING POWER SUPPLY SELF-DIAGNOSTICS IN REDUNDANT POWER ARCHITECTURES

(75) Inventors: Joseph P. King, Jr., Sterling, MA (US); Phillip J. Roux, Sutton, MA (US); Michael A. Faulkner, Acton, MA (US); Robert M. Beauchamp, Milford, MA (US); Robert A. Guenther, Pepperell, MA (US)

(73) Assignee: EMC Corporation, Hopkinton, MA (US)

( * ) Notice: Subject to any disclaimer, the term of this patent is extended or adjusted under 35 U.S.C. 154(b) by 198 days.

(21) Appl. No.: 12/571,428

(22) Filed: Sep. 30, 2009

(51) Int. Cl.
*G01R 31/36* (2006.01)
(52) U.S. Cl. .......................................... 702/63
(58) Field of Classification Search ............. 702/63
See application file for complete search history.

(56) References Cited

U.S. PATENT DOCUMENTS

| | | | | |
|---|---|---|---|---|
| 5,122,726 | A * | 6/1992 | Elliott et al. | 323/272 |
| 6,301,133 | B1 * | 10/2001 | Cuadra et al. | 363/65 |
| 6,774,663 | B2 * | 8/2004 | Moreaux et al. | 324/759.01 |
| 2005/0185352 | A1 * | 8/2005 | Nguyen | 361/90 |
| 2007/0029979 | A1 * | 2/2007 | Williams et al. | 323/217 |
| 2008/0164759 | A1 * | 7/2008 | Sharma et al. | 307/52 |
| 2008/0266740 | A1 * | 10/2008 | Smith | 361/91.5 |

* cited by examiner

*Primary Examiner* — Cindy H Khuu
(74) *Attorney, Agent, or Firm* — Krishnendu Gupta; R. Kevin Perkins

(57) ABSTRACT

A system for detecting latent defects within a redundant power architecture includes a plurality of redundant power supplies, each having one or more output power rails, connected in a redundant fashion to a system load; each power supply output having fault-isolating OR'ing circuitry that prevents reverse current flow when free of defects; each power supply having means for adjusting its output voltage; each power supply having means for monitoring an internal voltage therein, and, based on characteristics of the monitored internal voltage, determining the presence of latent defect/s in the fault-isolating "OR'ing" circuitry. Further, the system operates to shift the load demanded from power supplies in redundant power architectures to allow the power supplies to run at their optimum electrical efficiency.

6 Claims, 11 Drawing Sheets

METHOD AND APPARATUS FOR PERFORMING POWER SUPPLY SELF-DIAGNOSTICS IN REDUNDANT POWER ARCHITECTURES

FIELD OF THE INVENTION

The present invention is directed generally to power supply systems and, more particularly, to a method and system for providing self-diagnostic functionality to detect latent defects within a power system architecture.

BACKGROUND OF THE INVENTION

Computer systems requiring high-availability and fault tolerance often employ redundant power architectures that allow the systems to continue to run even if the input power to a power supply component is interrupted, or if a power supply component fails. These redundant power architectures include the use of a plurality of power supplies (typically isolated AC/DC Power supplies, but also isolated and non-isolated DC/DC Power supplies) that produce one or more output power rails which power the system circuitry. The use of more than one power supply or more than one output power rail allows the system to receive power from the redundant power supply or redundant power rail in the event the primary power supply or primary power rail is unable to provide power. The plurality of power supplies in such an architecture often contain electronic components on their outputs that allow the power supplies to source current to the system loads, but prevent current from flowing in the reverse direction from the load side back into the power supply. Preventing the reverse current flow is critical in redundant architectures so that a failed power supply does not load down the system bus. These "Fault-Isolation" devices that prevent reverse current flow into the power supply are commonly referred to in the art as "OR'ing" devices, as they allow the load to be powered from one power supply "OR" the other "redundant" power supplies.

Conventional architectures may use a diode or a Mosfet to provide the "OR'ing" function. Use of a semiconductor diode for this function provides simplicity from a design approach, but may suffer in comparison to a Mosfet with low source-drain resistance ("RDS") from an electrical efficiency approach. Regardless of the type of "OR'ing" device used, the "OR'ing" function is one important design element that must work properly in order to provide fault tolerant power to the system. Another design requirement in a redundant power architecture is to have redundant power supplies that are capable of supporting the requisite system load current in the event of a failure in one of the other power supplies. For example, in a system requiring "x" Watts with N+1 redundancy, the power architecture could employ two power supplies, each capable of independently providing "x" Watts of power. Having the second power supply is of little use if it is not properly sized, or if it is not functioning properly so that it is able carry the full system load.

Designing power supplies with "OR'ing" functionality, and adequately sizing those supplies to support the worst-case system load is relatively straightforward. However, ensuring that a particular power supply has (a) a properly functioning "OR'ing" feature, and (b) can properly support the requisite load when called upon, is problematic once the units are in operation in a system. While both of these functions can be, and typically are, initially tested by the power supply manufacturer prior to being installed in a computer system, the system in which they are installed can become vulnerable to a latent (hidden) defect in those features, if the defect occurs during or after the power supply installation in the system. For example, a defect in the "OR'ing" circuit such that the "OR'ing" device is "open" or "shorted" may go undetected until that power supply or its redundant power supply fails. At that point, the "open" or "shorted" "OR'ing" device can result in the interruption of power to the system. Similarly, a redundant power supply designed to supply "x" Watts that, due to some latent defect, can not support a full load of "x" Watts, would cause an interruption in power to the system if the peer supply experienced a failure. Interruption of power to the system (as described in the examples above) as a result of a latent defect in the power architecture is problematic to systems requiring high availability.

Currently, there is no method or system for testing for these defects in power supplies that are in operation in the field.

Another potential shortcoming in redundant power architectures is that sizing of the power supplies can be a challenge, as the total system loads may vary depending on the customer's desired system configuration. As a result, system designers often must oversize the power supply, from an output power rating perspective, to be capable of supporting the worst case system load. The consequence of this is that the power supply, when installed in a minimally configured system, may be running at very light loads when the peer power supply is not faulted. Since power supplies intended for use in redundant architectures are conventionally designed to have their optimal (greatest) electrical efficiency at or near fifty percent load, they will often suffer, somewhat, from a reduced efficiency when running at full or light load conditions. As a result, the power supplies used in conventional redundant power architectures may not be running at their optimum electrical efficiency, depending on the amount of load being demanded from them by the system.

SUMMARY OF THE INVENTION

The system and method described herein addresses several shortcomings of the redundant power architectures found in fault-tolerant systems of the prior art. First, the invention discloses a method and apparatus for actively testing for particular latent defects in power supplies in operation in the field, and if found, reporting those defects to the larger system such that the adverse effects of those latent defects can be mitigated. Second, the invention discloses a method and apparatus for shifting the load demanded from power supplies in redundant power architectures to allow the power supplies to run at their optimum electrical efficiency.

BRIEF DESCRIPTION OF THE DRAWINGS

These and other features will become more readily apparent from the following detailed description when read together with the accompanying drawings, in which.

DETAILED DESCRIPTION

The system and method described herein addresses challenges with detecting certain types of latent defects within a redundant power system architecture before those defects can compromise the operation of the larger system. Through a process of monitoring and control features, the system is able to actively detect and report latent defects in a power supply sub-system, while the larger system is operating properly. The system is also able to optimize the electrical efficiency of power supplies used in redundant power architectures, when those power supplies are often operating at less than optimal load conditions, such that efficiency is not maximized.

Figure 1:
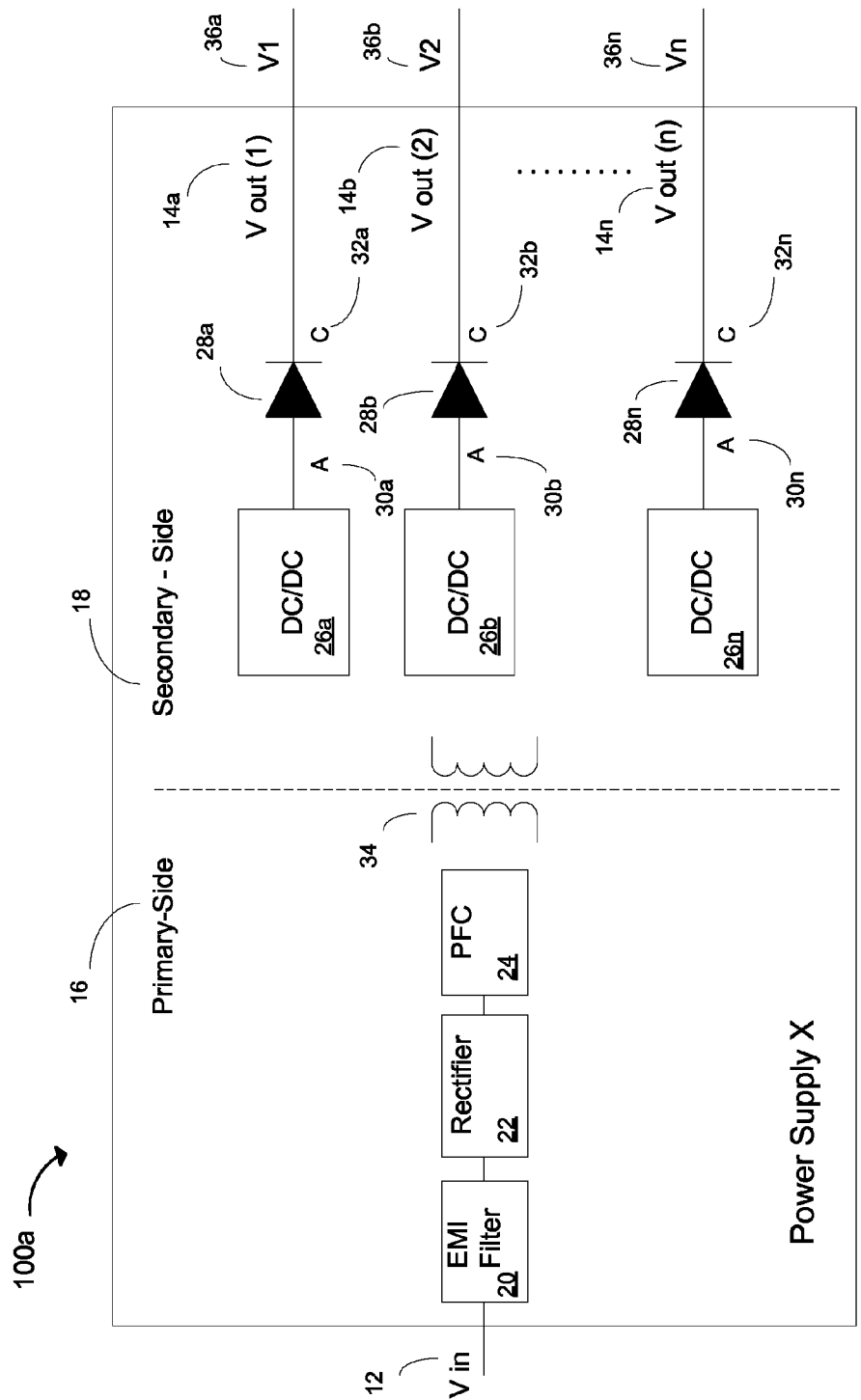
FIG. 1 is a block diagram of a power supply with OR'ing diode devices as used in the prior art.

FIG. 1 is an illustration of a conventional AC/DC Power supply 100a, having a primary side 16, and a secondary side 18. The AC/DC power supply is conventionally used in the art to convert AC (alternating current) utility power to the lower voltage DC (direct current) required by many electronic systems. The primary-side electronics in supply 100a conventionally contain an electro-magnetic interference (EMI) filter stage 20 that is connected as close as possible to the input power feed 12, followed by a rectifier stage 22, followed by a power factor control (PFC) stage 24. A transformer 34 is conventionally used to step the higher voltage on the primary-side down to a lower voltage on the secondary-side and to provide isolation. Secondary-side circuitry in a conventional AC/DC power supply may include one or more DC/DC Converters 26a-26n that regulate the output voltage on power supply outputs 14a-14n to the desired value, as required by the system electronics they are powering. These DC/DC converter stages often include protection features, such as over-voltage protection (OVP), and over-current protection (OCP). The "OR'ing" circuitry on power supply outputs 14a-14n are used in redundant power supply architectures to allow the power supply outputs 14a-14n to power the system power rails 36a-36n, while preventing reverse current flow from the system rails back into the power supply outputs 14a-14n. The "OR'ing" circuitry depicted in FIG. 1 uses semiconductor diodes 28a-28-n, each having an anode-side 30a-30n and a cathode-side 32a-32n.

Figure 2:
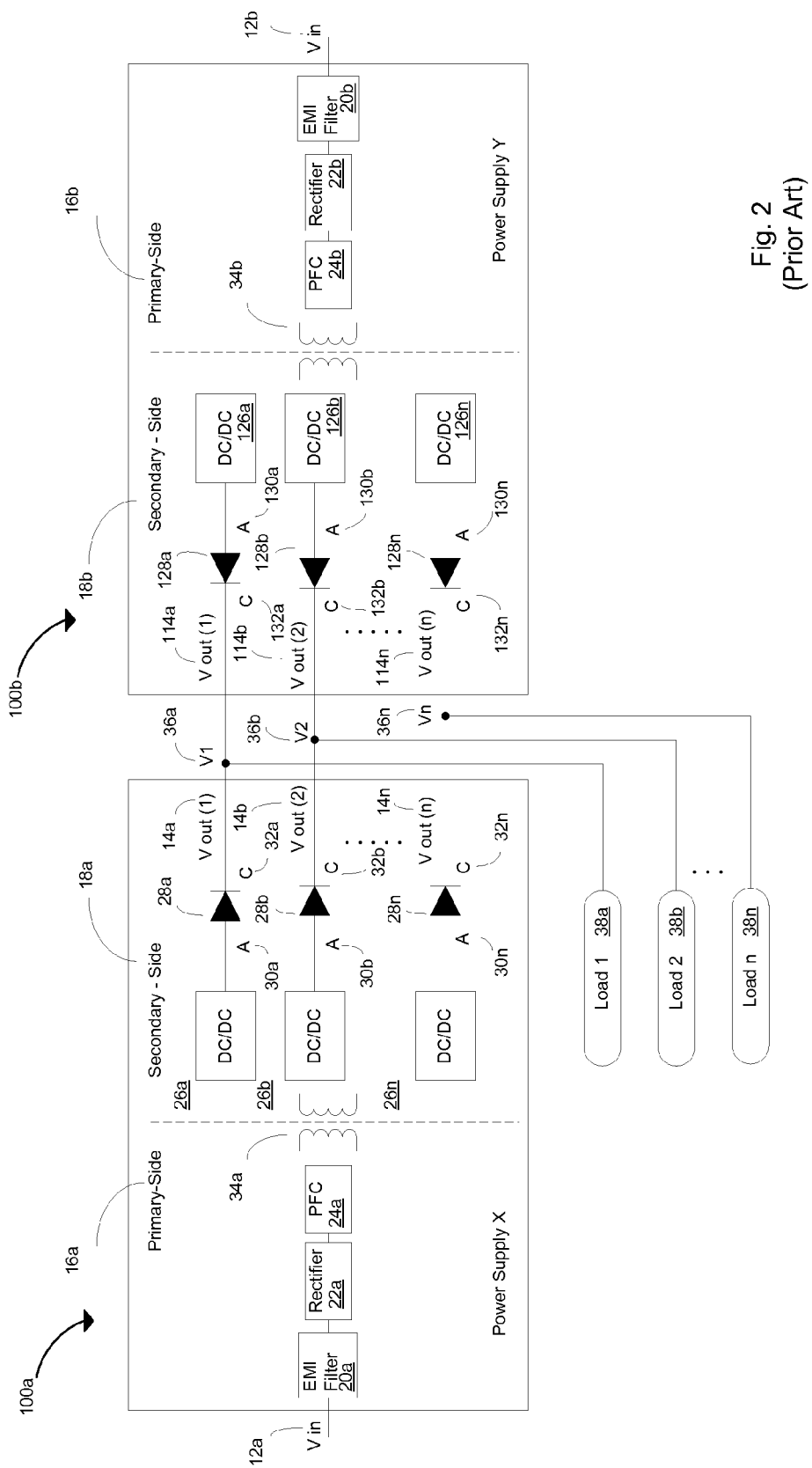
FIG. 2 is a block diagram of a pair of power supplies with OR'ing diode devices, and having their outputs tied together to provide a redundant power source to the loads, as used in the prior art.

FIG. 2 depicts a conventional redundant power architecture, with two redundant AC/DC power supplies 100a and 100b, each respectively having primary-sides 16a and 16b, and secondary-sides 18a and 18b, where the primary-sides each respectively depict an input power feed 12a and 12b, EMI filter 20a and 20b, rectifier 22a and 22b and PFC stage 24a and 24b. Primary-side to secondary-sides are each bridged via transformers 34a and 34b, of power supplies 100a and 100b, respectively. The example of FIG. 2 depicts the AC/DC power supplies 100a and 100b with "n" number of outputs (14a-14n and 114a-114n respectively), powering three independent system loads 38a-38n via system power rails 36a-36n. As shown, each Power Supply 100a and 100b has "n" number of voltage outputs, and "n" number of DC/DC converters 26a-26n in power supply 100a and 126a-126n in power supply 100b. Each of these DC/DC converters are connected to system power rails 36a-36n in an "OR'ing fashion", using semiconductor diodes 28a-28n in power supply 100a, and 128a-128n in power supply 100b, such that the cathodes of these diodes 32a-32n and 132a-132n are on the downstream or system side, and the anodes 30a-30n and 130a-130n are on the upstream or DC/DC side.

Figure 3:
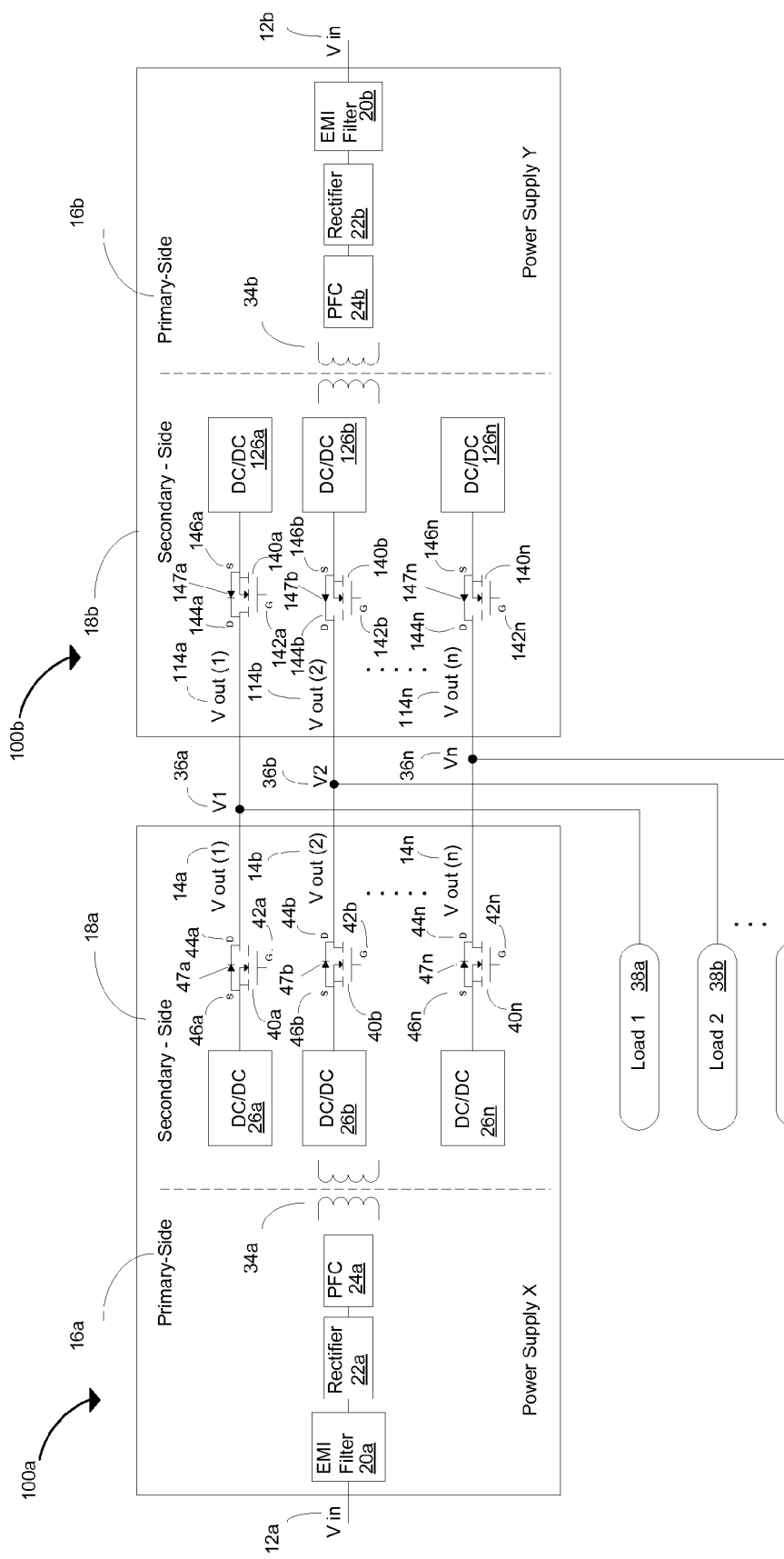
FIG. 3 is a block diagram of a pair of power supplies with OR'ing Mosfet devices, and having their outputs tied together to provide a redundant power source to the loads, as used in the prior art.

FIG. 3 illustrates the "two-power supply" redundant power architecture example previously discussed in FIG. 2 (above), with "n" number of outputs, similar in all respects with the exception of the "OR'ing" devices used. While FIG. 2 depicts semiconductor diodes 28a-28n and 128a-128n for the fault isolating "OR'ing" function, FIG. 3 instead depicts N-Channel Mosfets 40a-40n for power supply 100a, and 140a-140n for power supply 100b, for that same "OR'ing" function. Mosfets are often used in the art for providing the "OR'ing" function instead of diodes, to maximize the power supply electrical efficiency. The Mosfets shown in FIG. 3 each have a Source pin 46a-46n for power supply 100a, and 146a-146n for power supply 100b, a Drain pin 44a-44n for power supply 100a, and 144a-144n for power supply 100b, and a Gate pin 42a-42n for power supply 100a, and 142a-142n for power supply 100b. The Mosfets shown in this diagram are connected in an "OR'ing" fashion such that the Drain pins 44a-44n for power supply 100a, and 144a-144n for power supply 100b, are on the downstream or system side, and the Source pins 46a-46n for power supply 100a, and 146a-146n for power supply 100b, are on the upstream or DC/DC side. The "upstream" side will be referred to the "anode" side, and the "downstream side" will be referred to as the "cathode" side hereafter. The Gate pins 42a-42n for power supply 100a, and 142a-142n for power supply 100b, of these Mosfets would typically be connected to circuitry that would control the Mosfet to turn it on and off (not shown in this figure).

While the "OR'ing" devices depicted in FIGS. 1-3 are capable of providing the requisite fault isolation required in redundant power architectures, by allowing current to flow in the forward direction (from the power supply to the load) while preventing current to flow in the reverse direction (from the load back into the supply), systems with those power architectures were left vulnerable to latent defects that occurred once those systems were in service.

Figure 4:
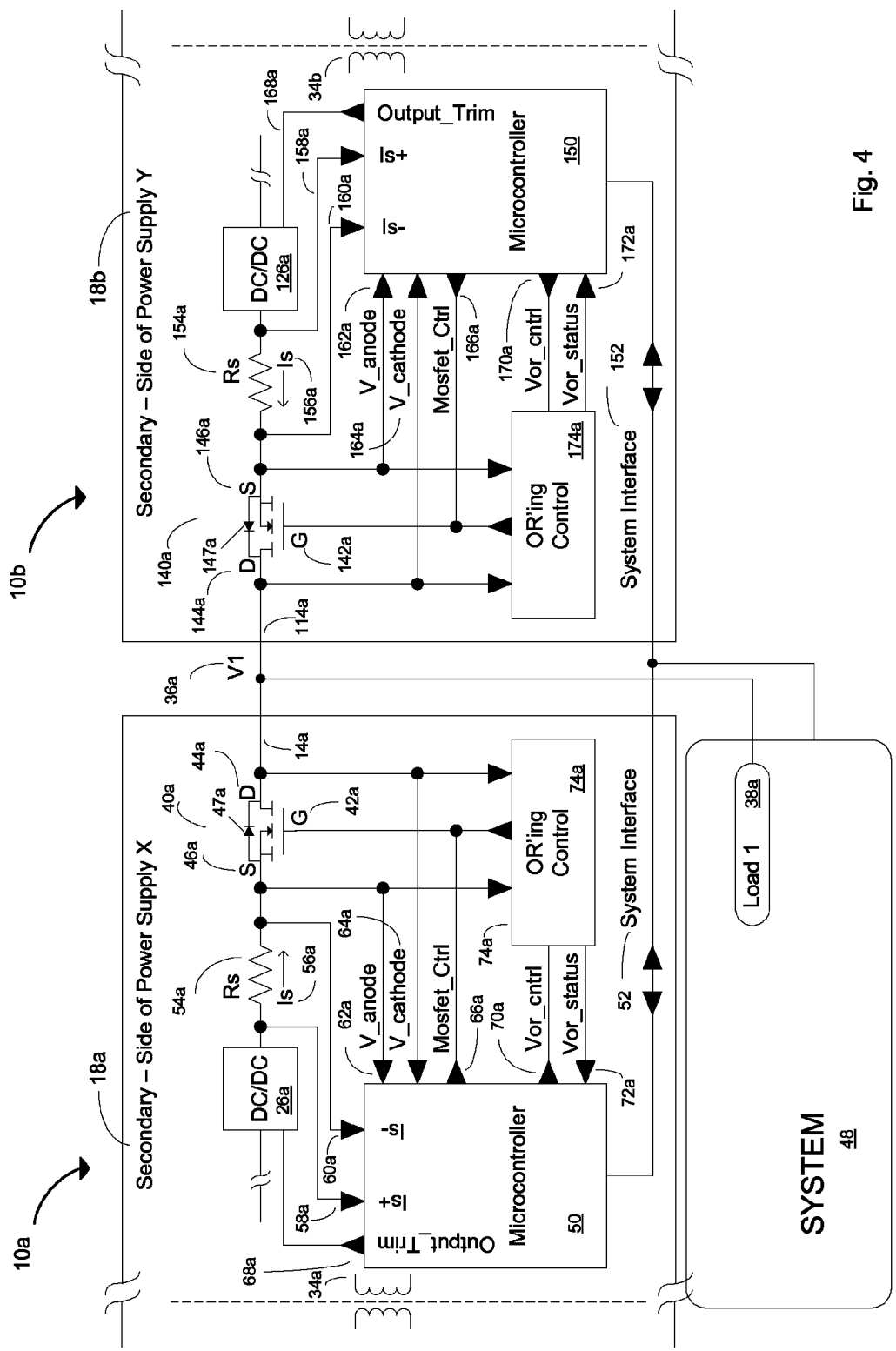
FIG. 4 is a block diagram depicting the interconnection of two power supplies, with a single output, having sufficient monitor and control elements for performing self-diagnostics in accordance with the present invention.

FIG. 4 depicts an embodiment of the present invention, showing only the secondary-sides 18a and 18b in detail of a two-power supply 10a and 10b redundant architecture. Though not shown, the primary-sides of power supplies 10a and 10b are similar to the primary sides shown in FIGS. 1-3. Each power supply 10a and 10b includes a single power output 14a and 114a respectively, that powers a single system load 38a, via power rail 36a. Illustrated in this figure is an example of the requisite control and monitoring elements that allow for the detection and reporting of a specific set of latent defects in the power architecture, in accordance with the present invention. The control and monitoring functions are described below with reference to FIGS. 7-11.

The system includes an architecture where the DC/DC stages 26a, 126a in power supplies 10a, 10b respectively, are adjustable, such that the output voltage can be "trimmed" up or down via control signals 68a, 168a of power supplies 10a and 10b respectively. These control signals may take the form of a General Purpose Input Output (GPIO) signal, Pulse Width Modulated (PWM) signal, or any control signal capable of adjusting the output voltage set point. In addition, the system includes sufficient monitoring capability of output current 56a, 156a, as well as anode voltage 62a, 162a and cathode voltage 64a, 164a in power supplies 10a, 10b respectively. While FIG. 4 depicts a Mosfet for the "OR'ing" devices 40a, 140a for power supplies 10a and 10b respectively, it will be understood that a diode could be used for the same function. Each power supply 10a, 10b includes a microcontroller 50, 150 for controlling the power output 14a, 114a via control signal 68a, 168a. This microcontroller is shown as monitoring the output current 56a and 156a, as sensed through sense resistor 54a and 154a, by measuring the voltage across this resistor through signals 58a, 60a and 158a, 160a. Alternatively, the output current may be measured by measuring the voltage drop from 62a to 64a and 162a to 164a across the Mosfet (or diode if used instead of Mosfet) 40a and 140a, for power supplies 10a and 10b respectively. Examples of microcontrollers that may be utilized in this embodiment include the PIC18F65J15 and PIC24FJ64 devices available from Microchip Technology, Inc. of Chandler, Ariz. While microcontrollers 50, 150 are shown as providing the monitoring and control functions in the embodiment, it will be understood that discrete circuitry may be used to perform the very same functions. OR'ing control devices 74a and 174a are each shown as a single block. It will be understood to those of ordinary skill in the art that the OR'ing Control devices contain the requisite circuitry to control the Mosfets 40a, 140a (such as charge pump, detection of reverse current, and enable/disable timing) so that that the Mosfets can provide the "OR'ing" function. The OR'ing control devices may be implemented using discrete circuitry, or may be implemented with an integrated circuit designed specifically for that purpose. One example of such an integrated circuit is the TPS2413 chip available from Texas Instruments of Dallas, Tex.

As discussed above, this embodiment uses the control and monitoring capability to detect the presence of a specific set of latent defects, and, if found, can report the defect to the system 48 over a system interface 52 and 152. The system 48 is the equipment requiring the redundant power architecture that power supplies 10a, 10b provide and may be a computer system, data storage system or any electronic system requiring redundant power supplies. The system interface 52, 152 may be in the form of GPIO signal/s, serial or parallel signal/s, visible or audible indicator, or any means that can convey the fault information to the system 48. The failure could be conveyed directly to a user of the system 48 via a simple visible or audible indictor.

Figure 5:
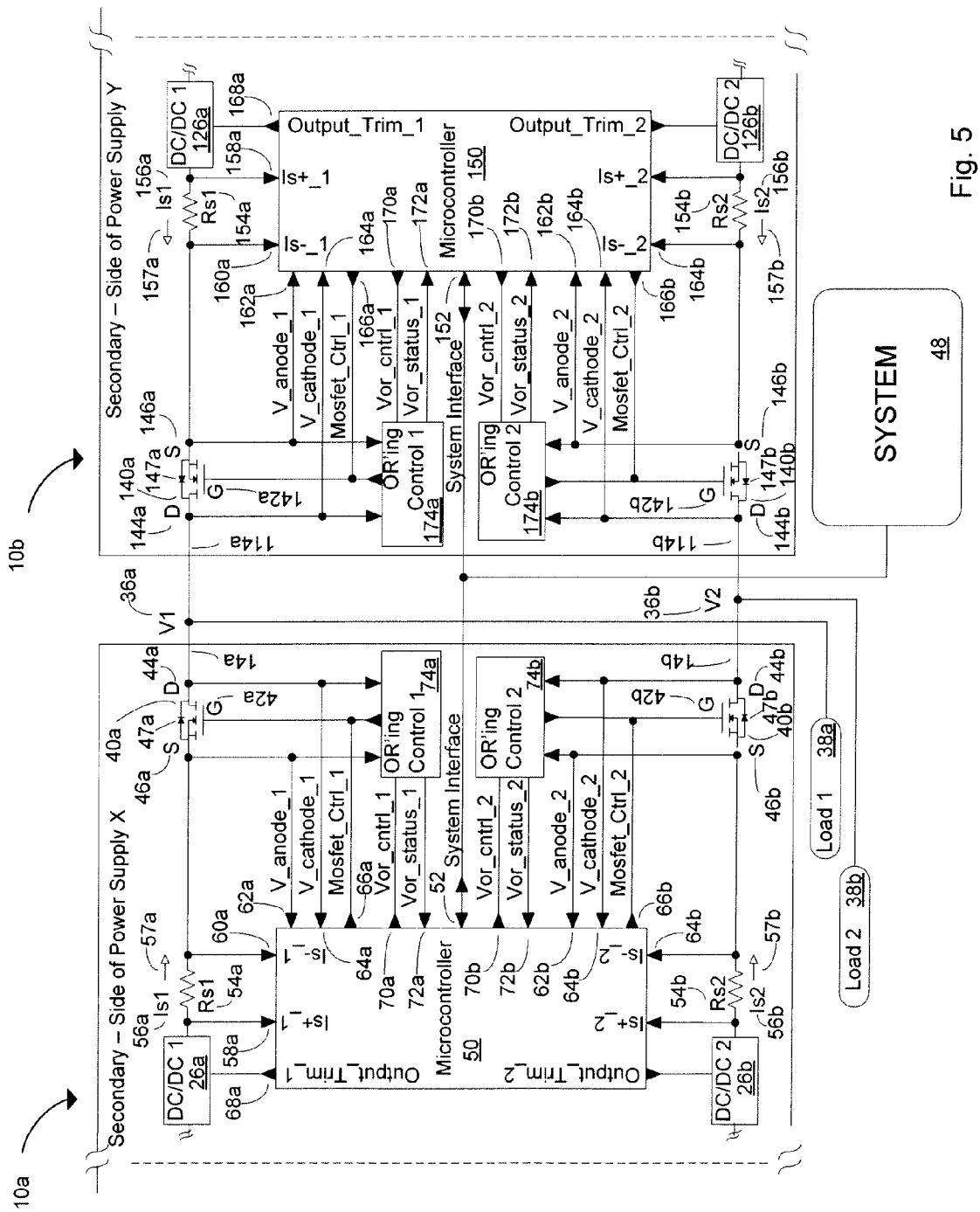
FIG. 5 is a block diagram depicting the interconnection of two power supplies, with two outputs, having sufficient monitor and control elements for performing self-diagnostics in accordance with the present invention.

FIG. 5 also depicts a redundant power architecture comprised of two power supplies 10a and 10b, similar in all respects to the architecture shown in FIG. 4, with the exception of each power supply 10a, 10b having two independent power outputs 14a, 14b and 114a, 114b respectively, that power two system power rails 36a and 36b instead of the single power outputs of FIG. 4. FIG. 5 illustrates the concept that the present invention is applicable to one or more power supply outputs, as is often required in redundant power architectures. So, while a single and dual power output configuration are shown in FIG. 4 and FIG. 5 respectively, the invention disclosed is readily applicable to "n" number of outputs where "n" is greater than or equal to one.

Figure 6:
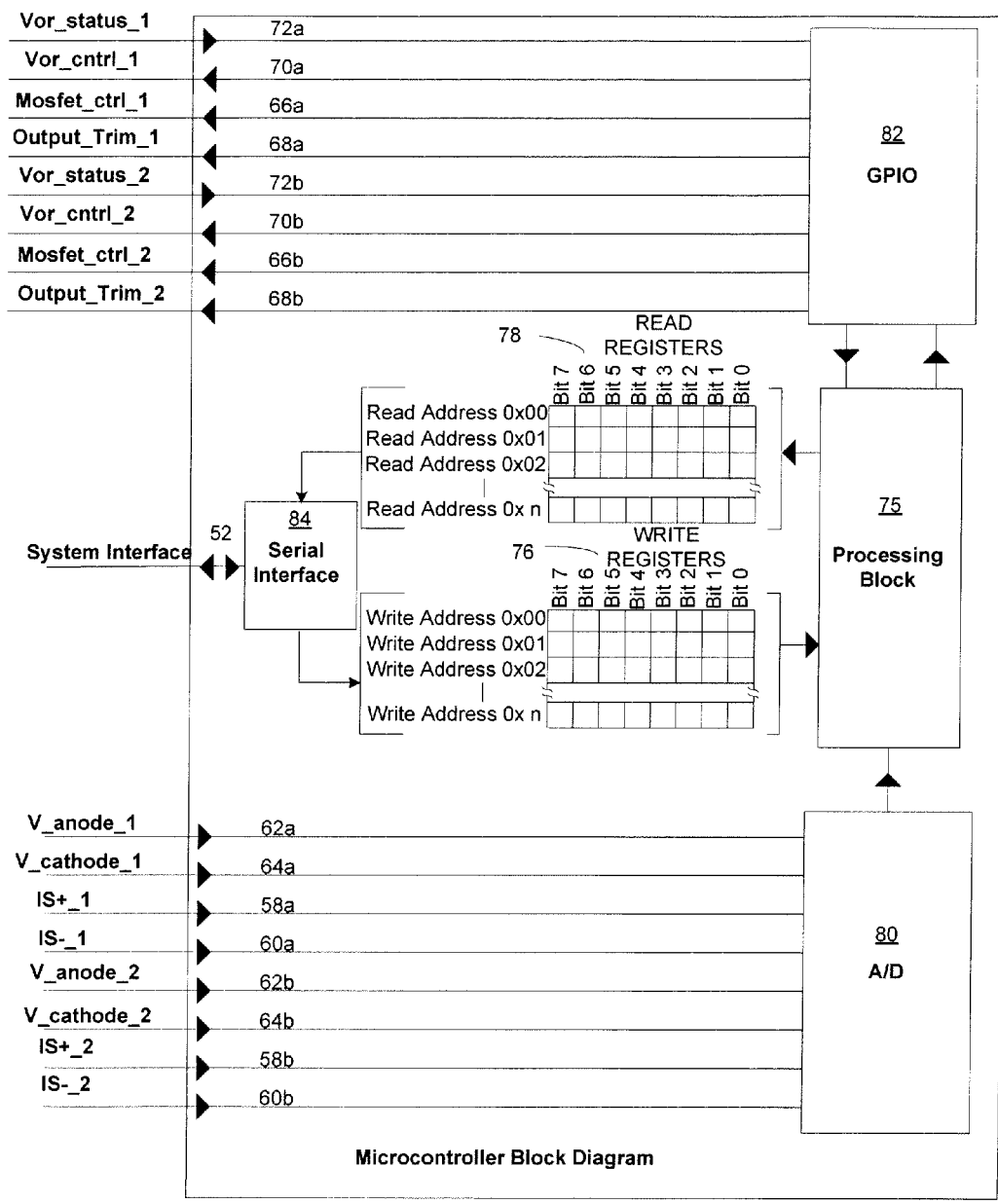
FIG. 6 is a detailed block diagram of the microcontroller element depicted in FIG. 5, in accordance with the present invention.

As discussed above, a microcontroller is shown as a viable component for providing the requisite control and monitoring functions in the present invention. FIG. 6 provides illustration of how the microcontroller 50, 150 in power supplies 10a, 10b of FIG. 5 can be used for this application. The microcontroller is being used in this particular embodiment to provide the requisite control and monitoring features of a two power output power supply for illustration purposes only, and could be easily scaled to apply to any number of "n" outputs, where "n" is greater than or equal to one. The microcontroller 50 used in this embodiment is comprised of a system interface 52 that is connected to the serial interface port 84 of the microcontroller. The system interface could instead be a GPIO, PWM or any method of exchanging data between the microcontroller and the larger system 48. The microcontroller 50 in this embodiment has a GPIO block 82, Analog-to-Digital converter (A/D) block 80, a processing block 75, and memory shown here in the form of Read Registers 78 and Write Registers 76. Microcontroller 50 is programmed to sense analog voltage via input pins 62a, 64a, 62b and 64b, as well as analog voltage that represent load currents via input pins 58a, 60a, 58b and 60b. Similarly, the microcontroller 50 in this embodiment can monitor the status from the OR'ing controllers 74a and 74b via GPIO inputs 72a, 72b. The microcontroller 50 can control or "trim" the amplitude of power outputs 14a, 14b, produced by DC/DC converters 26a, 26b via output control signals 68a and 68b. The microcontroller 50 can also control the OR'ing Mosfet 40a, 40b directly using outputs 66a and 66b. The processing block in this embodiment runs the method that performs the diagnostic testing in accordance with the present invention, which is described below with reference to FIGS. 7-11.

Figure 7:
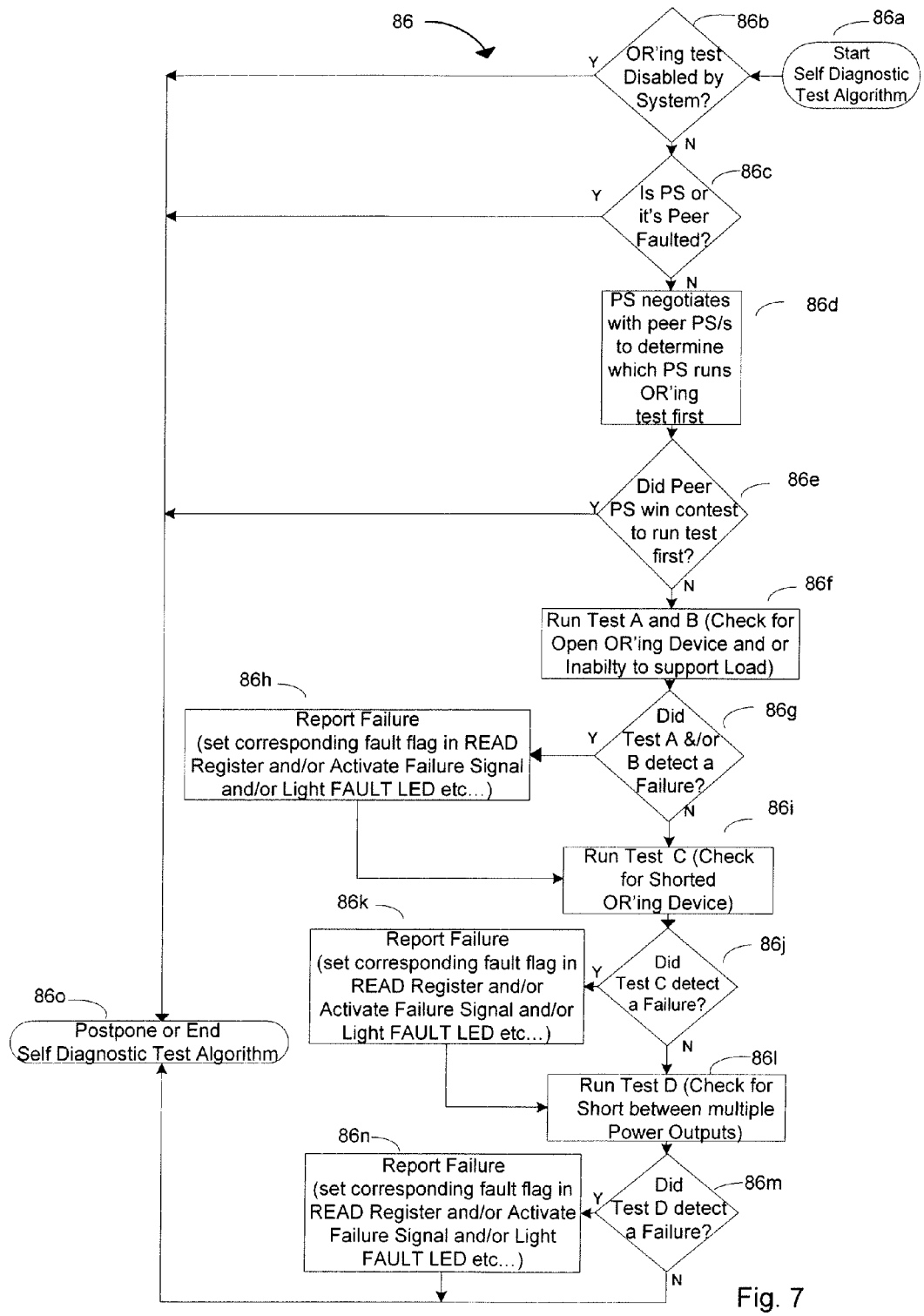
FIG. 7 is a flowchart that describes an embodiment of the method used to detect four types of latent defects in accordance with the present invention.

FIG. 7 depicts a high-level flowchart 86 of one embodiment of the self-diagnostic method in accordance with the present invention. The method, which is carried out in each power supply of a system, starts at step 86a. On power supplies with more than one output, this method may run independently on each output at the same time, or in any particular order. For the purposes of simplification, the following description will assume a single output power supply. The method proceeds to decision block 86b to determine if the system 48 needs to disable/postpone the test. Referring back to FIG. 6, the system 48 has access to the microcontroller 50 via system interface 52. Through the serial interface 84, the microcontroller 50 can receive instructions over the system interface 52, to disable/postpone the test, among other instructions, where those instructions are stored in write registers 76. If at step 86b, it is determined that the test should be disabled/postponed, the method proceeds to termination block 86o, and the test is ended. Otherwise, the method proceeds to decision block 86c. In decision block 86c, it is determined if one or more of the redundant "peer" supplies is faulted such that it is not prudent to continue performing these tests on this supply. Running the fault diagnostic test on a power supply whose peer is faulted may be undesirable, since the system would be depending on the supply to provide un-interrupted power while the faulted peer awaits service or replacement. If the peer power supply is faulted, the method proceeds to termination block 86o, otherwise it proceeds to process block 86d. Step 86d allows for the negotiation between the peer supplies so that both supplies do not run the test at the same time. If a peer supply wins the contest to run the test first, the method proceeds on to the termination block 86*o*. Otherwise, the method proceeds to the first diagnostic tests at process block 86*f*. In this embodiment, Test A & Test B at process block 86*f* are a sequence of monitoring and control steps that determine if the "OR'ing" device on the first of "n" outputs was detected as defective in the "open" state, and/or if the Power Supply was unable to support the required load. Test A and Test B are described in detail in FIG. 8. If Test A and or Test B detected a failure at decision block 86*g*, the failure is appropriately reported to the system 48 at step 86*h*, and the process continues on to step 86*i*. If no failure was detected, the process continues directly to Test C, at step 86*i*. Test C is described in detail in FIG. 9. In this embodiment, Test C at step 86*i* is a sequence of monitoring and control steps that determines if the "OR'ing" device on the first of "n" outputs was detected as defective in the "shorted" state. If Test C detected a failure at decision block 86*j*, the failure is appropriately reported to the system 48 at step 86*k*, and the process continues on to step 86*l*. If no failure was detected, the process continues directly to Test D, described in detail in FIG. 10, at process block 86*l*. In this embodiment, Test D at process block 86*l* is a sequence of monitoring and control steps that determines if the first of "n" power outputs was "shorted" to separate and independent power outputs. If Test D detected a failure at decision block 86*m*, the failure is appropriately reported to the system at step 86*n*, and the process continues on to termination block 86*o*. If no failure was detected, the method continues directly to termination block 86*o*.

While flowchart 86 describes one embodiment of the present invention that illustrates a sequential set of diagnostic tests (86*f*, 86*i*, and 86*l*) in a particular order, it is understood that the flow of these tests could be modified such that some are bypassed, repeated, reordered etc. . . . , depending on the system requirements. Similarly, while the flowchart illustrates the testing of just the first of "n" outputs, any number of power outputs could be tested in a similar manner. For supplies with more than one output, it may be necessary to run step 86*f* of FIG. 7 at the same time (in parallel) on each of the outputs, to accurately detect "inability to support required load" latent defects.

In accordance with the present invention, and as shown in FIG. 7, the method employed directs itself to detecting specific latent defects within a power architecture that is in service in an electronic system.

Figure 8:
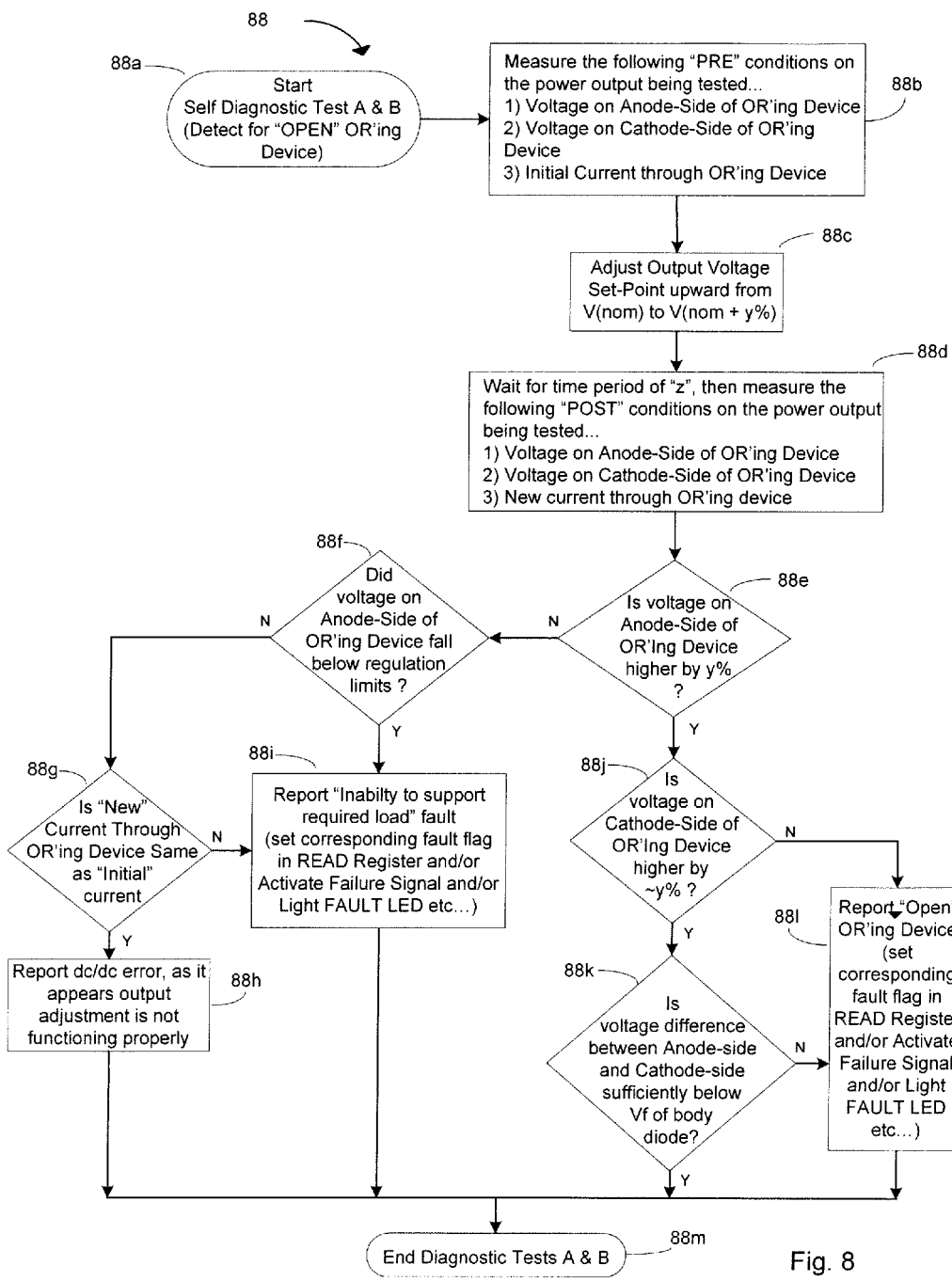
FIG. 8 is a flowchart that describes an embodiment of the method used to detect latent "Open" OR'ing device/s defects and/or "Inability to Support Full-Load" defects, as referenced in FIG. 7, in accordance with the present invention.

FIG. 8 depicts a flow chart 88 that describes a method for detecting latent "Open OR'ing device" defects in a redundant power architecture, and an "Inability to support the required load" latent defect, which has been previously referred to as Test A and Test B respectively, as shown in process block 86*f* of FIG. 7. The following discussion will assume a single output power supply architecture for the purposes of clarity. If the power supply running the method did have more than one power output, it may be necessary to run the following method on each of the outputs at the same time (in parallel), to ensure that Test B would accurately find a "inability to support required load" latent defect.

Now, with reference to secondary-side 18*a* of power supply 10*a* shown in FIG. 4, this flowchart begins at step 88*a*. At step 88*b*, the microcontroller 50 measures, and stores in memory, the "pre-trim" anode voltage 62*a* and pre-trim cathode voltage 64*a* of the "OR'ing" device 40*a*, as well as the pre-trim current 56*a* through the "OR'ing" device 40*a*. The process then flows to step 88*c*, where the microcontroller 50 adjusts or "trims" the output voltage set-point on the output 14*a* from the nominal voltage (e.g. the nominal regulated voltage the system 48 requires) to a voltage higher than that nominal voltage by "y" percent. The value of "y" can depend on many factors, such as, but not limited to, the maximum voltage allowed by the system, the load sharing between the redundant power supplies, the accuracy of the voltage adjustment capabilities, and the accuracy of the voltage and current monitoring functions. Once the voltage is trimmed to this higher set-point, the process flows to step 88*d*, where, after some short delay period, the microcontroller 50 re-measures, and stores in read registers 78, the "post-trim" anode voltage 62*a*, post-trim cathode voltage 64*a* of the "OR'ing" device 40*a*, as well as the post-trim current 56*a* through the "OR'ing" device 40*a*. The process then flows to step 88*e*.

If at step 88*e*, the post-trim anode voltage 62*a* did not increase to the higher set-point of Vnominal plus "y" percent (within acceptable tolerances), the process flows to step 88*f*. If the post-trim anode voltage 62*a* fell below regulation limits (where the regulation limits are defined by the acceptable voltage range required by the system 48 to operate properly) as a result of the "trim-up" procedure at step 88*c*, it is indicative of the power supply being unable to support the requisite load current, and the process flows to step 88*i* where the "Inability to Support Required load" defect would be reported to the system 48, and then to termination block 88*m*.

A power supply that could carry the required load after being trimmed up slightly would be expected to maintain regulation, even though it was now sourcing more current as a result of its higher output voltage set-point from step 88*c*. If however, the anode voltage 62*a* remained within regulation limits (determined at step 88*f*) as a result of the "trim-up" procedure of step 88*c*, the process would flow from step 88*f* to step 88*g*. At step 88*g*, the post-trim current 56*a* through the "OR'ing" device 40*a* measured at step 88*d* is compared against the pre-trim current 56*a* measured at step 88*b*. If those current readings did not match (within acceptable tolerances), the test suggests there is still an inability to support the required load latent defect, and that to would be reported at step 88*i*, and then to termination block 88*m*. However, if the pre-trim current 56*a* measured at 88*b* and post-trim current measured at 88*d* do match (within acceptable tolerances), it suggests there could be some other defect in the DC/DC control circuitry that is preventing the output to properly trim. In that case, the process would flow to step 88*h* so that that "non-latent" defect could be reported, and then to termination block 88*m*.

If at step 88*e*, the pre-trim anode voltage 62*a* did increase to the new output voltage set-point (within acceptable tolerances), which would confirm a functional trim circuit, a determination then needs to be made if the "OR'ing device 40*a* is working as expected, or if instead it might be in an "open" state. In step 88*j* this determination is made by verifying that the post-trim cathode voltage 64*a* of the "OR'ing" device 40*a* did indeed increase to the new set-point of Vnominal plus "y" percent (within acceptable tolerances). If it did not, the process flows to step 88*l*, where an "open OR'ing device" defect is reported to the system 48, and then to termination block 88*m*. However, if at step 88*j* the post-trim cathode voltage 64*a* of "OR'ing" device 40*a* did increase, and the "OR'ing" device 40*a* is a semiconductor Mosfet (as opposed to a semiconductor diode), a determination still needs to be made if there could be a latent "open" defect, but that it is still being hidden because of conduction through the "body diode" internal to the Mosfet. This body diode and its orientation is depicted as 47*a* and 147*a* in FIG. 4. This determination is made at decision block 88*k*, where the differential voltage from "anode" side to "cathode" side of the Mosfet "OR'ing" device 44*a* is measured. If the voltage drop measured across the "OR'ing" device 40a is large enough to be consistent with the forward voltage Vf of the body diode, then an "Open OR'ing Device" latent defect is reported at step 88l, and the process terminates at 88m. If the device was not defective, the expected voltage drop through the Mosfet 40a would be a value lower than the forward voltage Vf of the body diode, but instead equivalent to the current through that device, multiplied by the "$R_{DS}$-ON Resistance" of that device. If the "OR'ing device in the power supply is a semiconductor diode, and not a Mosfet, this block is bypassed and the process terminates at block 88m.

Figure 9:
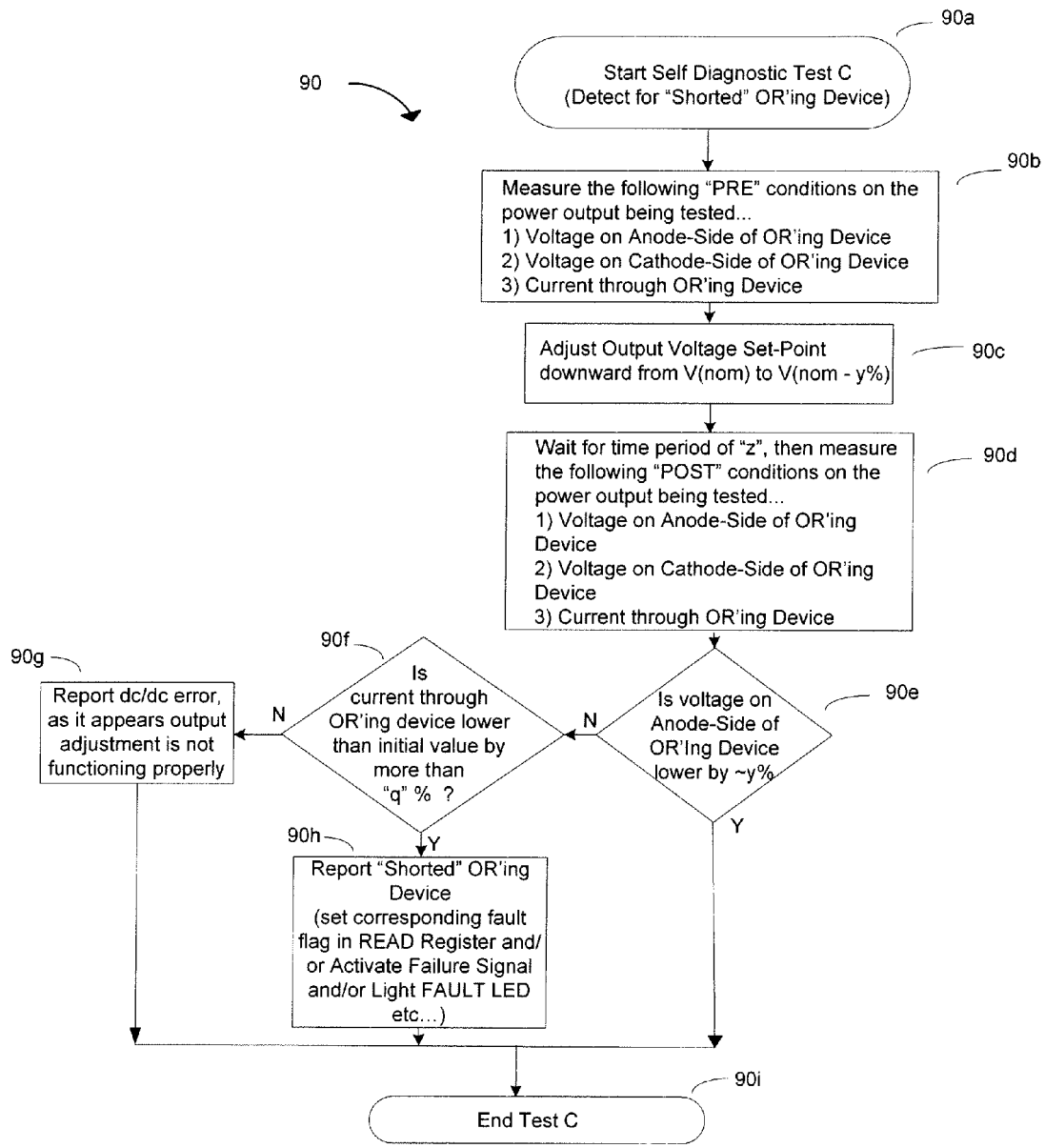
FIG. 9 is a flowchart that describes an embodiment of the method used to detect latent "Shorted" OR'ing device/s defects, referenced in FIG. 7, in accordance with the present invention.

FIG. 9 depicts a flow chart 90 that describes an method for detecting a "shorted" OR'ing device latent defect in a redundant power architecture, which has been previously referred to as Test C, process block 86i of FIG. 7. Again, with reference to secondary-side 18a of power supply 10a shown in FIG. 4, the process starts at step 90a, and flows to step 90b, where the microcontroller 50 measures, and stores in memory, the pre-trim anode voltage 62a and pre-trim Cathode voltage 64a of the "OR'ing" device 40a, as well as the pre-trim current 56a through that "OR'ing" device 40a. The process proceeds to step 90c, where the microprocessor 50 adjusts or "trims", via control signal 68a, the output voltage set-point on the output 14a from the nominal voltage (e.g. the nominal regulated voltage the system requires) to a voltage lower than that nominal voltage by "y" percent. Again, the value of "y" can depend on many factors, such as, but not limited to, the minimum allowable voltage allowed by the system, the load sharing between the redundant power supplies, the accuracy of the voltage adjustment capabilities, and the accuracy of the voltage and current monitoring functions. Once the output voltage 14a is trimmed to this lower set-point, the process flows to step 90d, where after some short delay period, the microcontroller 50 re-measures, and stores in read registers 78, the post-trim anode voltage 62a and post-trim cathode voltage 64a, as well as the post-trim current 56a through that "OR'ing" device 40a. The process then flows to decision block 90e.

If at step 90e, the post-trim anode voltage 62a of the "OR'ing" device 40a did not decrease to the new set-point, as set at step 90c, (within acceptable tolerances), the process flows to step 90f, where the pre-trim current 56a, and post-trim current 56a through the "OR'ing" device 40a are compared. If the post-trim current 56a through the "OR'ing" device 40a remained unchanged from the pre-trim current 56a value, it suggests there could be some other defect in the DC/DC control circuitry 26a that is preventing the output to properly trim. In that case, the process would flow to step 90g to report the "non-latent" defect, and then to termination block 90i. If post-trim current 56a through the "OR'ing" device 40a fell below the pre-trim current 56a value (within specified tolerances), and the anode voltage 62a never decreased as determined at step 90e, it indicates the "OR'ing" device 40a may be shorted such that the redundant power supply (the supply not currently being tested, and still at the nominal voltage set-point) was now providing most, if not all, of the system load current (and thus reducing the load current demand on the output being tested). In this case, the process would flow to step 90h where the "Shorted OR'ing Device" latent defect would be reported to the system 48, and then to termination block 90i.

Figure 10:
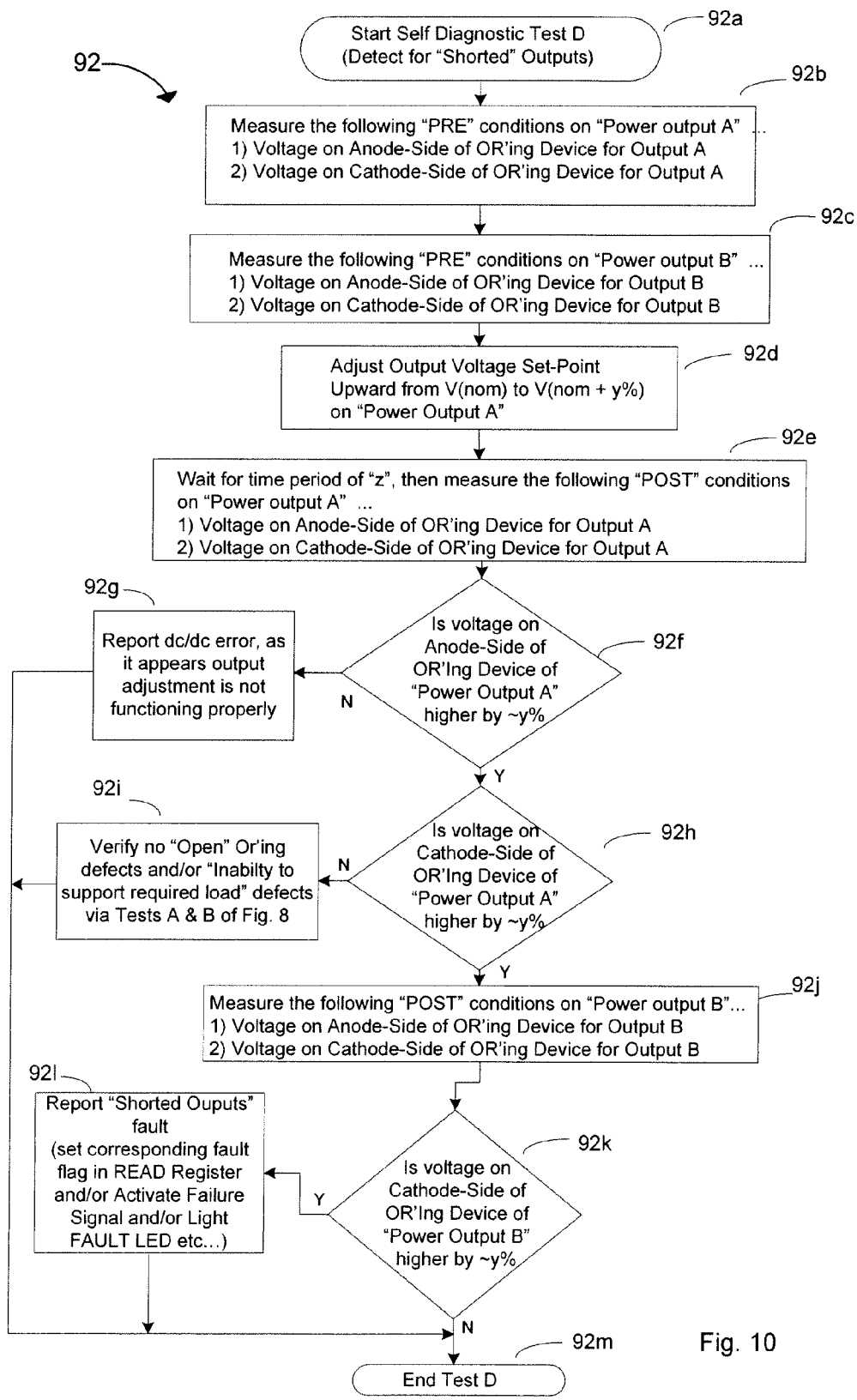
FIG. 10 is a flowchart that describes an embodiment of the method used to detect a latent short between power outputs, referenced in FIG. 7, in accordance with the present invention.

FIG. 10 depicts a flow chart 92 that describes an method for detecting a latent "short" between the tested output and another independent power output found in a redundant power architecture, which has been previously referred to as Test D, process block 86l of FIG. 7. This flowchart, for the purposes of clarity, assumes Tests A, B and C in FIGS. 8 and 9 have already run and passed. While this is not a requirement for the system to operate, it allows simplification of this particular embodiment of Test D. Referring this time to FIG. 5, this flowchart begins at Start step 92a, and flows to step 92b, where the microcontroller 50 measures, and stores in memory, the pre-trim anode voltage 62a and pre-trim cathode voltage 64a of "OR'ing" device 40a for power output 14a (referred to here as Power Output A for illustration purposes). The process then flows to step 92c where the microcontroller 50 measures, and stores in memory, the pre-trim anode voltage 62b and pre-trim cathode voltage 64b of "OR'ing" device 40b for power output 14b (referred to here as Power Output B for illustration purposes) that should not be connected to Power Output A, unless there is a latent defect that is shorting Power Output A and Power Output B together.

The process then flows to step 92c, where the microcontroller 50 adjusts or "Trims" the power output set-point on Power Output A from the nominal voltage (e.g. the nominal regulated voltage the system requires) to a voltage higher than that nominal voltage by "y" percent. The value of "y" can depend on many factors, such as but not limited to the max allowable voltage allowed by the system, the load sharing between the redundant power supplies, the accuracy of the voltage adjustment capabilities, and the accuracy of the voltage and current monitoring functions. Once the voltage is trimmed to this higher set-point, the process flows to step 92e, where after some short delay period, the microcontroller 50 re-measures, and stores in read registers 78, the post-trim anode voltage 62a and post-trim cathode voltage 64a of Power Output A. The process then flows to step 92f. At step 92f, it is determined if the anode voltage 62a of Power Output A increased to the new set point as expected. If it did not, the process moves to step 92g where a fault is reported as a non-latent "DC/DC adjustment fault", since prior latent testing (previously described in FIGS. 8 and 9) already ruled out other types of latent defects), and then to termination block 92m. If the anode voltage 62a of Power Output A increased as expected (determined at 92f), the process moves to step 92h. At step 92h, a determination is made if the cathode voltage 64a of Power Output A also increased. If the answer is no, the process moves to step 92i where testing would occur to determine if there might be an "Open OR'ing device" or "Inability to support required load" defect (as previously described in FIG. 8 as Tests A and Test B). Beyond that, the process would flow to termination block 92m. If instead, the cathode voltage 64a did increase at step 92h as expected, the process would flow to step 92j. There, the microcontroller 50 re-measures, and stores in memory, the post-trim anode voltage 62b and post-trim cathode voltage 64b of "OR'ing" device 40b for Power Output B. The process then flows to decision block 92k where a determination is made if the cathode voltage 64b of the "OR'ing" device 40b of Power Output B also increased un-expectantly to the post-trim value set-point of Power Output A. If the post-trim cathode voltage 64b did indeed unexpectedly increase, the process moves to step 92l, where the "Shorted Outputs" latent defect is reported, and then to termination block 92m. However, if the cathode voltage 64b of Power Output B remained unchanged from Power Output B's pre-trim cathode voltage value, as measured at step 92c, the process flows directly to 92m, and the test is ended.

Tests A-D as shown in FIGS. 8-10 each describe a process whereby a power supply adjusts or "trims" its output voltages upward or downward, while leaving the peer supply at its nominal output voltage. It is understood that the method employed could just as easily trim the output voltage of one supply in one direction by a percentage, while its peer trims its output voltage in the opposite direction. For example, if the Test requires a differential voltage of y % between the output voltage on, for example, power supply A and power supply B, to accurately determine a particular type of latent defect, the method employed could achieve this differential voltage by:

a) Trimming power supply A's output voltage in one direction by y % from nominal, while leaving the output voltage of power supply B at nominal, or b) Trimming power supply A's output voltage in one direction by y/2% from nominal, while Trimming power supply B's output voltage in the opposite direction by y/2% from nominal.

Figure 11:
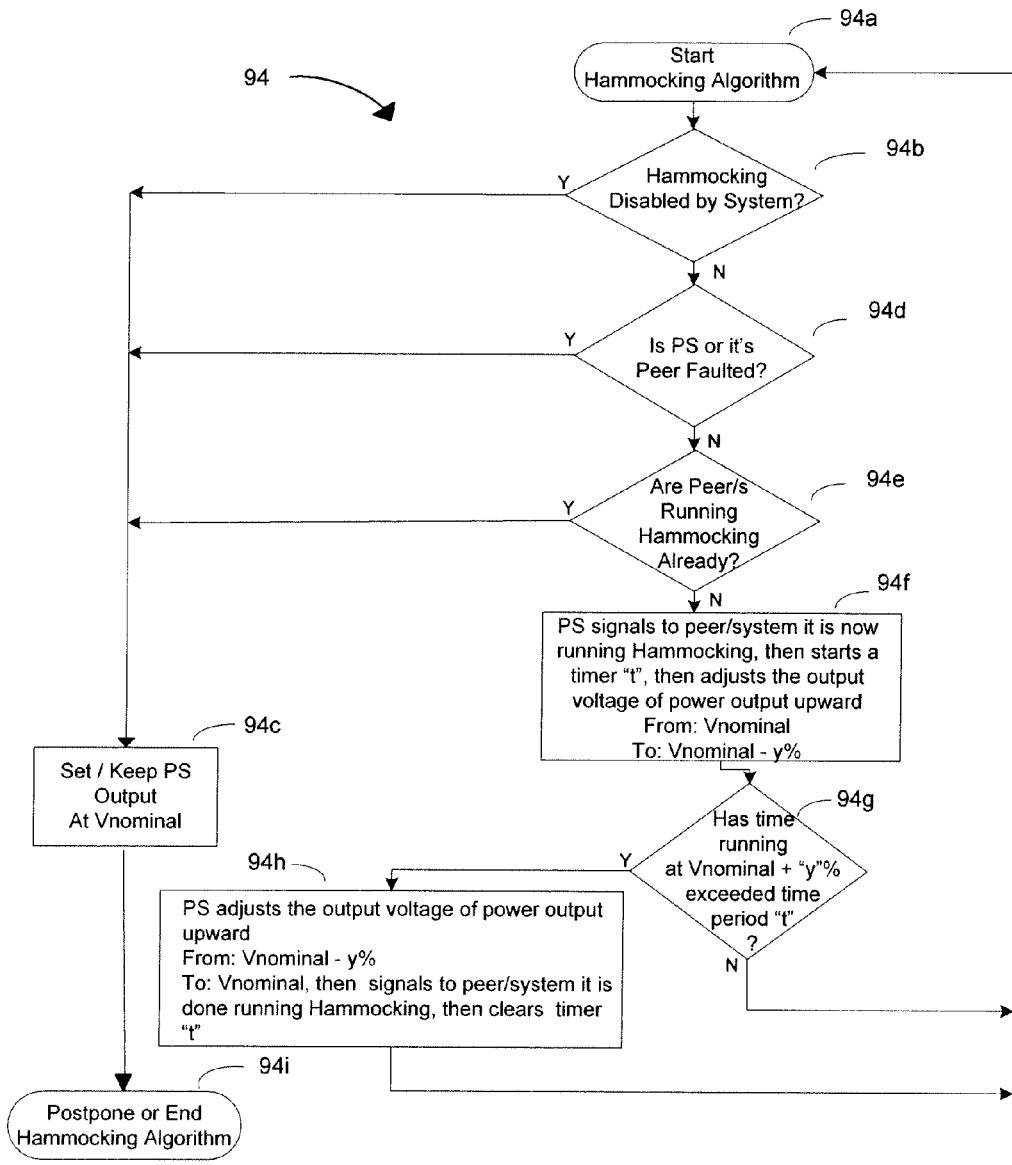
FIG. 11 is a flowchart that describes an embodiment of the method used to optimize the electrical efficiency of a power supply architecture, in accordance with the present invention.

FIG. 11 describes a "Hammocking" process by which a redundant power architecture utilizes the output voltage trimming features described above, to maximize the overall electrical efficiency of the power supplies in that architecture, when those supplies are running redundantly, such that their output load current is at or below the level at which the supply operates most efficiently.

The electrical efficiency of a conventional power supply may vary depending on the amplitude of the input voltage conditions (line) as well as the amplitude of the output current sourced (load). While it is desirable to have the power supply running at its greatest electrical efficiency (to minimize the cost of wasted power), it becomes a challenge to design for this, as the line and load conditions can vary greatly while the power supply is operating in service. The output voltage control features, described above for latent fault detection, can be employed to re-balance the load demand on redundant power supplies operating in service, that would otherwise be running at light load conditions (less than 50%), such that the load would increase on the supply with the higher output voltage set-point to a point that that supply would be running at a higher electrical efficiency. This process of adjusting the output voltage set-points on the redundant power supplies, such that the load shifts from one supply to its peer is coined here as "hammocking". Referring to both FIG. 4, the flowchart in FIG. 11 begins at step 94a.

FIG. 11 describes the "hammocking" process by which a redundant power architecture utilizes the output voltage trimming features described above, to maximize the overall electrical efficiency of the power supplies in that architecture, when those supplies are running redundantly, such that their output load current is at or below the level at which the supply operates most efficiently.

The electrical efficiency of a conventional power supply may vary depending on the amplitude of the input voltage conditions (line) as well as the amplitude of the output current sourced (load). While it is desirable to have the power supply running at its greatest electrical efficiency (to minimize the cost of wasted power), it becomes a challenge to design for this, as the line and load conditions can vary greatly while the power supply is operating in service. The output voltage control features, described above for latent fault detection, can be employed to re-balance or shift the load demand on redundant power supplies operating in service, that would otherwise be running at light load conditions (less than 50%), such that the load would increase on the supply with the higher output voltage set-point to a point where that supply would be running at a higher electrical efficiency. This process involves adjusting the output voltage set-points on the redundant power supplies, such that the load shifts from one supply to its peer.

FIG. 11 depicts a high-level flowchart 94 of one embodiment of the "Hammocking" algorithm, in accordance with the present invention. For illustration purposes, the algorithm will be described with references to the two-power supply redundant architecture of FIG. 4. The algorithm, run in each power supply, described here starts at step 94a. The process flows to decision block 94b to determine if the system has disabled hammocking The system has access to the microcontrollers 50, 150 via system interface 52. Through the serial interface 84 (shown in FIG. 6), the microcontroller 50, 150 can receive instructions over the system interface 52, to disable hammocking, among other instructions, where those instructions are stored in write registers 76 (as shown in FIG. 6). If, at step 94b, it is determined that hammocking should be disabled, the process flows to step 94c, where the output voltage 14a, 114a is returned (or kept at if already there) to the un-trimmed value of Vnominal, then flows to termination block 94i. If instead hammocking is not disabled, the process flows to step 94d. At step 94d, it is determined if one or more of the redundant "peer" supplies is faulted such that it is not prudent to run, or continue to run, hammocking on the power supply. Running hammocking on a power supply whose peer is faulted may be undesirable, since the system would be depending on the supply to provide un-interrupted power while the faulted peer awaits service or replacement. If the peer power supply is faulted, the process flows to termination block 94c where the output voltage 14a, 114a is returned (or kept at if already there) to the un-trimmed value of Vnominal, then flows to termination block 94i. If the peer is not faulted, the process flows to 94e, where the power supply 10a, 10b determines if the peer supply is already running hammocking. This determination can be made by reading information sent to the power supply over the system interface 52. The form of the information can be as simple as a GPIO signal, or a serial or parallel data stream that originates at the system or peer power supply, so long as the power supply can decide if it is time to run hammocking now, or if instead it should wait until the peer is finished. If at step 94e it is determined that the peer power supply is running hammocking already, the process flows to step 94c where the output voltage 14a, 114a is returned (or kept at if already there) to the un-trimmed value of Vnominal, then flows to termination block 94i. Otherwise, the process flows to step 94f to begin hammocking.

At step 94f, the power supply signals to the peer power supply, via system interface 52, that it is now running hammocking, starts a timer "t", and adjusts or "trims", via control signal 68a, 168a the output voltage 14a, 114b from a value of Vnominal to a lower value of Vnominal minus "y" percent. The value of "y" can vary based on the application, but is a value sufficient to decrease the load current 56a, 156a to the supply, and increase the load current 156a, 56a on the peer supply, to a point where the peer power supply, now sourcing most of the system load current, is running at a higher efficiency point. While the output voltage 14a, 114a of the power supply is lower than Vnominal by "y" percent while in this "hammock" mode, it is still within regulation limits (as previously described) so that it can adequately provide power to the system if the peer supply were to suddenly become faulted. The process then flows to step 94g, where it is determined if the hammocking timer "t" has expired. If so, the process flows to step 94h, where the power supply returns the output voltage 14a, 114a back to Vnominal, signals to the system 48 via system interface 52 that it is no longer in hammocking mode, clears timer "t", and returns back to the beginning at step 94a. If instead, timer "t" had not expired, as decided at step 94g, the power supply would remain in "hammocking mode," and return directly to step 94a.

The hammocking algorithm described in FIG. 11, in essence, allows a redundant power architecture to cycle the system load, back and forth between a power supply, and its peer, such that each supply would be "working" for some period of time "t", and "resting" for some period of time "t", insuring neither supply was subjected to a disproportionate share of the overall service life. This prevents a situation where one supply might suffer a lower Mean-Time-Between-Failure (MTBF) as compared to its peer. When "working", the supply would have a better overall efficiency, than it would if it had to share the load with its peer. When "resting", the supply would be sourcing little-to-no current, but would be ready to support the system load if the peer supply were to suddenly become faulted, as its output voltage would be sitting at a value just slightly lower (by "y" percent) than the "working supply", but still within the regulation limits required by the system.

The system and method described herein may find applicability in any computing or processing environment. The system and method may be implemented in hardware, software, or a combination of the two. For example, the system and method may be implemented using circuitry, such as one or more of programmable logic (e.g., an ASIC), logic gates, a processor, and a memory.

The system and method may be implemented in computer programs executing on programmable computers that each includes a processor and a storage medium readable by the processor (including volatile and non-volatile memory and/or storage elements). Each such program may be implemented in a high-level procedural or object-oriented programming language to communicate with a computer system and method. However, the programs can be implemented in assembly or machine language. The language may be a compiled or an interpreted language.

Each computer program may be stored on an article of manufacture, such as a storage medium (e.g., CD-ROM, hard disk, or magnetic diskette) or device (e.g., computer peripheral), that is readable by a general or special purpose programmable computer for configuring and operating the computer when the storage medium or device is read by the computer to perform the functions of the data framer interface. The system and method also may be implemented as a machine-readable storage medium, configured with a computer program, where, upon execution, instructions in the computer program cause a machine to operate to perform the functions of the system and method described above.

Implementations of the system and method may be used in a variety of applications. Although the system and method is not limited in this respect, the system and method may be implemented with memory devices in microcontrollers, general-purpose microprocessors, digital signal processors (DSPs), reduced instruction-set computing (RISC), and complex instruction-set computing (CISC), among other electronic components.

Implementations of the system and method may also use integrated circuit blocks referred to as main memory, cache memory, or other types of memory that store electronic instructions to be executed by a microprocessor or store data that may be used in arithmetic operations.

Additionally, implementations of the system and method described above need not be performed by a computer and/or computing device and may be performed manually. A number of implementations have been described. Nevertheless, it will be understood that various modifications may be made. Accordingly, other implementations are within the scope of the following claims.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

The invention claimed is:

1. A system for detecting latent defects within a redundant power architecture comprising:
   a plurality of redundant power supplies, each comprising:
      at least output power rail, connected in a redundant fashion to a system load;
      fault-isolating OR'ing circuitry having an output connected to the at least output power rail that prevents reverse current flow when free of defects;
      a voltage adjusting device for adjusting its output voltage connected to an input of the fault-isolating OR'ing circuitry;
      a monitoring device for monitoring an internal voltage within the fault-isolating OR'ing circuitry, and, based on an effect of adjusting an output voltage on the at least one output power rail on characteristics of the monitored internal voltage, determining a presence of one or more latent defects in the fault-isolating OR'ing circuitry.

2. The system of claim 1 wherein the voltage adjusting device comprises a DC/DC stage for adjusting the internal voltage based on a control signal from a control device of each power supply.

3. The system of claim 1 wherein the one or more latent defects comprise at least one of an open OR'ing circuitry, an inability of a power supply to support a required load, a shorted OR'ing circuitry and a short between two or more of the plurality of power supplies.

4. The system of claim 3 wherein determining a presence of one or more latent defects in the fault-isolating OR'ing circuitry comprises increasing an output voltage for a power supply under test from a first voltage value to a second voltage value, monitoring input and output characteristics of the associated OR'ing circuitry, and determining a presence of one or more latent defects in the fault-isolating OR'ing circuitry based on a comparison of the first and second voltage values.

5. The system of claim 1 wherein the one or more latent defects comprise at least one of an open OR'ing circuitry, an inability of a power supply to support a required load, a shorted OR'ing circuitry and a short between two or more of the plurality of power supplies.

6. The system of claim 5 wherein determining a presence of one or more latent defects in the fault-isolating OR'ing circuitry comprises increasing an output voltage for a power supply under test from a first voltage value to a second voltage value, monitoring input and output characteristics of the associated OR'ing circuitry, and determining a presence of one or more latent defects in the fault-isolating OR'ing circuitry based on a comparison of the first and second voltage values.

* * * * *